(12) United States Patent
Overbey et al.

(10) Patent No.: US 8,976,503 B2
(45) Date of Patent: Mar. 10, 2015

(54) VOLTAGE MONITORING FOR FIRESET

(75) Inventors: Jacob T. Overbey, South Boston, MA (US); Abel Livingstone, Haverhill, MA (US)

(73) Assignee: Textron Systems Corporation, Wilmington, MA (US)

( * ) Notice: Subject to any disclaimer, the term of this patent is extended or adjusted under 35 U.S.C. 154(b) by 254 days.

(21) Appl. No.: 13/568,179

(22) Filed: Aug. 7, 2012

(65) Prior Publication Data

US 2015/0040786 A1 Feb. 12, 2015

(51) Int. Cl.
*F23Q 7/00* (2006.01)
*F23Q 21/00* (2006.01)
*G01V 1/06* (2006.01)
*H05B 43/02* (2006.01)

(52) U.S. Cl.
USPC .......................................................... 361/248

(58) Field of Classification Search
CPC ............ F42B 3/121; F42D 1/045; F42D 1/05
USPC ................................... 361/248; 102/206, 215
See application file for complete search history.

(56) References Cited

U.S. PATENT DOCUMENTS

| | | | |
|---|---|---|---|
| 4,536,693 A | 8/1985 | Marek | |
| 4,829,899 A * | 5/1989 | Wiker et al. | 102/206 |
| 4,986,183 A * | 1/1991 | Jacob et al. | 102/200 |
| 5,063,846 A * | 11/1991 | Willis et al. | 102/215 |
| 5,146,104 A * | 9/1992 | Schumacher et al. | 307/10.1 |
| 5,173,570 A | 12/1992 | Braun | |
| 5,444,598 A * | 8/1995 | Aresco | 361/253 |
| 5,460,093 A * | 10/1995 | Prinz et al. | 102/217 |
| 5,488,536 A | 1/1996 | Bonavia et al. | |
| 5,600,293 A | 2/1997 | Hunter | |
| 6,138,571 A * | 10/2000 | Denney | 102/206 |
| 6,324,979 B1 | 12/2001 | Troianello | |
| 6,634,298 B1 * | 10/2003 | Denney | 102/206 |
| 7,116,543 B2 * | 10/2006 | Kim et al. | 361/251 |
| 7,236,345 B1 * | 6/2007 | Roesler et al. | 361/247 |
| 7,301,750 B2 * | 11/2007 | DeVries et al. | 361/248 |
| 8,242,620 B2 * | 8/2012 | Kikuchi et al. | 290/44 |
| 8,573,124 B2 * | 11/2013 | Havran et al. | 102/206 |
| 2003/0075069 A1* | 4/2003 | Boucher et al. | 102/217 |
| 2005/0178282 A1* | 8/2005 | Brooks et al. | 102/202.7 |
| 2007/0125256 A1* | 6/2007 | Frickey et al. | 102/205 |
| 2007/0295237 A1* | 12/2007 | Bossarte et al. | 102/501 |
| 2011/0056399 A1* | 3/2011 | Yan et al. | 102/215 |
| 2011/0277620 A1* | 11/2011 | Havran et al. | 89/1.14 |
| 2012/0118190 A1 | 5/2012 | Fisher | |
| 2013/0125772 A1* | 5/2013 | Backhus et al. | 102/206 |

* cited by examiner

*Primary Examiner* — Rexford Barnie
*Assistant Examiner* — Christopher Clark
(74) *Attorney, Agent, or Firm* — BainwoodHuang

(57) ABSTRACT

An improved fireset for detonating an explosive includes a voltage monitor arranged to measure a voltage across a quickly dischargeable energy storage device (QDESD), such as a capacitor, and to perform a detonation sequence based at least in part on the voltage measured by the voltage monitor. The fireset employs feedback from the voltage monitor to promote accurate charging of the QDESD and accurate maintenance of charge during an armed state. The voltage monitor also promotes safety by allowing the fireset to indicate when the QDESD is discharged to a safe level, i.e., one which is assured not to result in detonation.

20 Claims, 3 Drawing Sheets

VOLTAGE MONITORING FOR FIRESET

BACKGROUND

Firesets are commonly used in military, construction, and industrial applications to detonate explosives. A conventional fireset includes a low energy exploding foil initiator (LEEFI) and a drive circuit. The LEEFI generally has a bridge wire with low electrical resistance (e.g., about 0.025-Ohms) placed in close proximity to a foil. The foil may be made of Mylar or some other suitable material. The foil is placed in close proximity (i.e., in contact or nearly so) with an explosive material. Various explosive materials are known in the art, and include, for example, C-4, Semtex, TNT, and nitroglycerin.

To detonate the explosive material, the drive circuit is activated to pass a high current through the LEEFI. The high current causes the bridge wire within the LEEFI to vaporize. The vaporized bridge wire forms a rapidly expanding plasma, which accelerates a metal foil "flyer" away from the bridge wire at high speeds. The flyer's path is designed to impact an initiator explosive, wherein the kinetic "slap" from the flyer delivers enough energy to initiate a detonation.

Various fireset designs have been proposed. For example, U.S. Pat. No. 5,600,293 to Donald Hunter discloses a fireset with a magnetically actuated triggering mechanism. Also, U.S. Pat. Nos. 6,138,571 and 6,634,298 to Jim Denney disclose firesets having drive circuits that each include a high voltage capacitor and a metal-oxide-semiconductor field-effect transistor (MOSFET) switch. When activated, the MOSFET switch causes charge on the capacitor to suddenly be dumped through the LEEFI, triggering detonation.

SUMMARY

Conventional firesets are designed essentially as single-use items that follow a one-way activation path. Through various means they each charge a capacitor and switch the capacitor across a LEEFI to detonate an explosive. Unfortunately, however, conventional firesets do not provide any way to confirm that their capacitor voltages have either 1) reached a high enough voltage to detonate their respective LEEFIs or 2) assumed a low enough voltage to ensure that detonation will not occur, thereby allowing safe handling of the fireset. In addition, conventional firesets do not provide any provably safe way to abort a detonation sequence once it is initiated.

In contrast with these prior designs, an improved fireset technique includes a voltage monitor arranged to measure a voltage across a quickly dischargeable energy storage device, such as a capacitor, and to perform a detonation sequence based at least in part on the voltage measured by the voltage monitor.

In some examples, a fireset includes a control circuit coupled to the voltage monitor for measuring the voltage of the quickly dischargeable energy storage device and for providing one or more control signals, in response to the measured voltage, for initiating different phases of a detonation sequence. In some examples, the control circuit and the voltage monitor share the same ground reference, i.e., the electrical signals they produce and/or receive are referenced to the same ground.

Certain embodiments are directed to a fireset for detonating an explosive. The fireset includes a discharge circuit including a quickly dischargeable energy storage device coupled in series with a LEEFI. The fireset also includes a high voltage source coupled to the discharge circuit to charge the quickly dischargeable energy storage device and a high voltage switch coupled to the discharge circuit and having a control input. The fireset still further includes a high voltage monitor coupled to the discharge circuit and having an output arranged to provide a voltage proportional to the voltage across the discharge circuit, and a control circuit having an input coupled to the output of the high voltage monitor and an output coupled to the control input of the high voltage switch. The control circuit is constructed and arranged to close the high voltage switch based at least in part on the voltage proportional to the voltage across the discharge circuit exceeding a predetermined threshold.

Also, certain embodiments are directed to a fireset for detonating an explosive. The fireset includes a discharge circuit including a high voltage capacitor coupled in series with a LEEFI and a high voltage source coupled to the discharge circuit to charge the high voltage capacitor. The fireset also includes a high voltage switch coupled to the discharge circuit and having a control input and a high voltage monitor coupled to the discharge circuit and having an output arranged to provide a signal proportional to the voltage across the discharge circuit. The fireset still further includes a control circuit having an input electrically coupled to the output of the high voltage monitor, a first output electrically coupled to the control input of the high voltage switch, and a second output electrically coupled to the high voltage source. The control circuit is constructed and arranged to close the high voltage switch based at least in part on the signal proportional to the voltage across the discharge circuit exceeding a predetermined threshold.

Other embodiments are directed to a method of detonating an explosive using a fireset. The method includes charging, from a high voltage source, a discharge circuit including a quickly dischargeable energy storage device coupled in series with a LEEFI. The method further includes monitoring a voltage across the discharge circuit and activating, by a control circuit, a first control signal to close a high voltage switch coupled to the discharge circuit, based at least in part on the monitoring indicating that the voltage across the discharge circuit exceeds a predetermined threshold.

BRIEF DESCRIPTION OF THE SEVERAL VIEWS OF THE DRAWINGS

The foregoing and other features and advantages will be apparent from the following description of particular embodiments of the invention, as illustrated in the accompanying drawings, in which like reference characters refer to the same parts throughout the different views. The drawings are not necessarily to scale, emphasis instead being placed upon illustrating the principles of various embodiments of the invention. In the accompanying drawings.

DETAILED DESCRIPTION OF THE INVENTION

An improved fireset technique includes a voltage monitor arranged to measure a voltage across a quickly dischargeable energy storage device, such as a capacitor, and to perform a detonation sequence based at least in part on the voltage measured by the voltage monitor.

Figure 1:
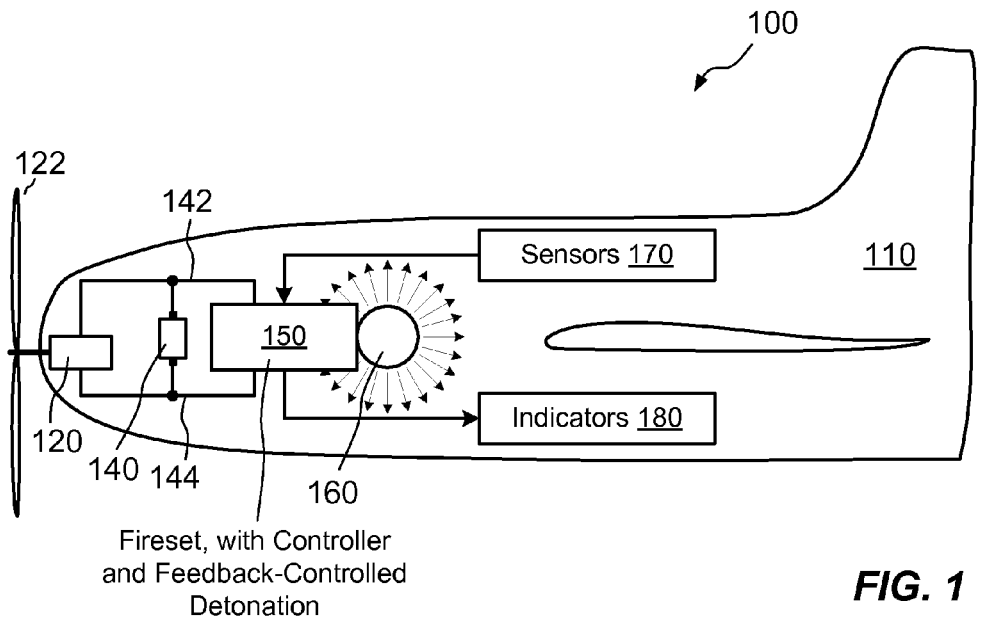
FIG. 1 is a block diagram showing an example environment in which an improved fireset with high voltage feedback is implemented.

FIG. 1 shows an example environment 100 including an improved fireset 150 equipped with a high voltage monitor. The environment 100 is seen to include an airplane 110, such as an unmanned, remote-controlled airplane, which may be configured to fly into a target and detonate an explosive 160 on impact with the target. The airplane 110 includes a motor 120 for driving a propeller 122. A battery 140 supplies power to the motor 120 via conductors 142 and 144. The battery 140 also supplies power to a fireset 150, as well as other powered apparatus within the airplane 110. The fireset 150 includes a controller and can be configured to detonate the explosive 160 at a designated instant in time. In an example, the controller within the fireset 150 is an Electronic Safing and Arming Device (ESAD). The fireset 150 may receive input signals from various sensors 170, and may produce output signals for driving various indicators 180. Example sensors 170 include position sensors (e.g., for altitude and coordinates) and communication sensors (e.g., electromagnetic, optical, etc.) for receiving control signals, such as those directing the fireset 150 to perform any of its designated functions, from a remote controlling unit (not shown). Example indicators 180 include light-emitting diodes (LEDs) or other indicators producing human-detectable signals communicating the status of the fireset 150. Example indicators 180 communicate information pertaining to whether the fireset 150 is armed (i.e., charged and ready for detonation), whether its voltage is discharged to a safe level (i.e., one that is assured not to result in detonation), and/or whether a command has been received to detonate the explosive 160. Instead of, or in addition to, providing human-detectable signals, the indicators 180 may also provide electronic, electromagnetic, optical, laser, or other signals to be conveyed over some medium to the remote controller or to a remote listening device.

Figure 2:
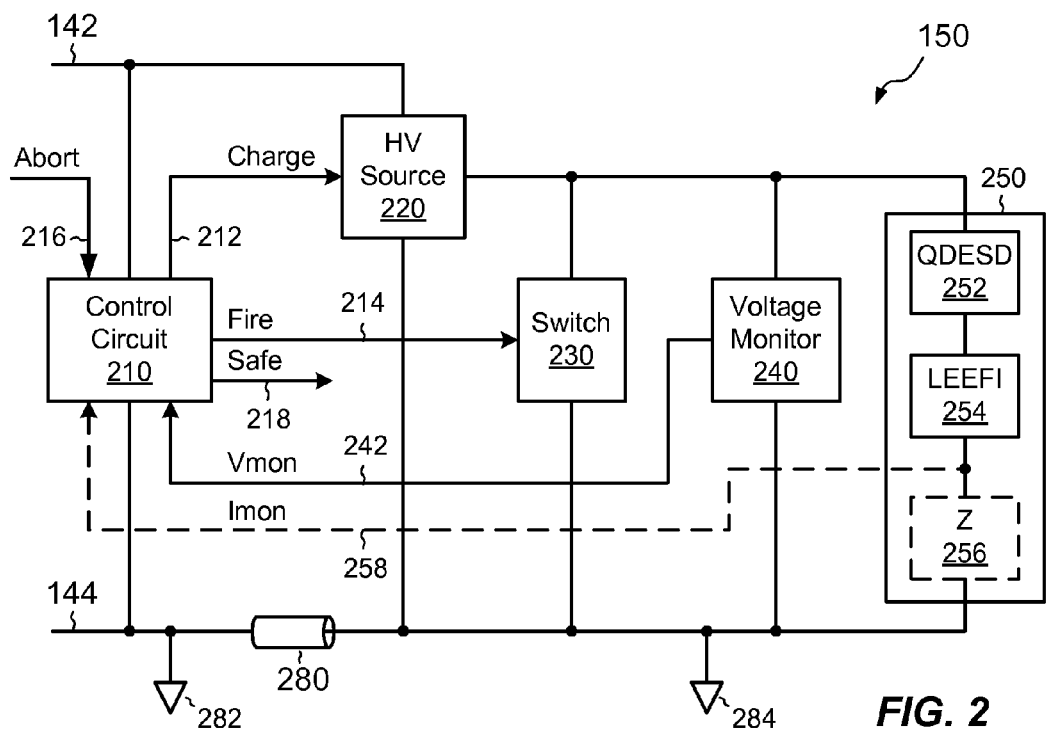
FIG. 2 is a block diagram of the example fireset of FIG. 1.

FIG. 2 shows additional details of the fireset 150. Here, it is seen that the fireset 150 includes a control circuit 210, a high voltage source 220, a normally open switch 230, a voltage monitor 240, and a discharge circuit 250. The fireset 150 may also include an inductive element 280, such as a ferrite core or inductor, which can decouple the control circuit 210 from transients induced from the high voltage source 220 and when the switch 230 is closed. The control circuit 210 and the voltage monitor 240 share the same ground reference. In the example shown, a ground 282 of the control circuit 210 is connected and DC-coupled to a ground 284 of the voltage monitor 240 through the inductive element 280. The voltage between the ground 282 and the ground 284 is zero on average, although it may be caused to vary dynamically in response to transients. The illustrated common ground arrangement allows the control circuit 210 to measure the output of the voltage monitor 240 without re-referencing or level translation, while the inductive element 280 protects the control circuit 210 from current spikes. Including the inductive element 280 also promotes testability of the fireset 150, because it allows the fireset 150 to be run repetitively (without the explosive 160) without damaging the control circuit 210 with high current pulses that would otherwise occur each time the switch 230 is closed.

The discharge circuit 250 includes a quickly dischargeable energy storage device (QDESD) 252 and a LEEFI 254. The discharge circuit 250 may optionally include an impedance 256, such as a current sense resistor, an inductor, or both, connected in series. The current sense resistor may be used to measure current through the LEEFI 254, and the inductor may be used to control ringing when the switch 230 is closed.

The QDESD 252 generally includes a high voltage capacitor. In an example, the QDESD 252 is a capacitor with a ceramic dielectric. Other dielectrics may be used, such as Mylar film, for example. The QDESD 252 may optionally include a bleeder resistor integrated with the capacitor in a single package. In various examples, the QDESD 252 may include one or more capacitors, supercapacitors, ultracapacitors, and/or batteries.

In operation, the control circuit 210 receives power from the battery 140, e.g., via conductors 142 and 144. According to a predetermined sequence, the control circuit 210 issues a control signal (i.e., the "Charge" signal 212) to the high voltage source 220 for charging the QDESD 252. The high voltage source 220, upon receiving the Charge signal 212, generates high voltage and conducts the high voltage to the discharge circuit 250 to charge the QDESD 252. The voltage monitor 240 measures the voltage across the discharge circuit 250, and conveys a signal indicating the measured voltage (i.e., the Vmon signal 242) to the control circuit 210. The LEEFI 254 and the impedance 256 (if included) typically have low values of impedance. Therefore, the voltages across the LEEFI 254 and the impedance 256 are typically small compared to the voltage across the QDESD 252 and the voltage measured by the Vmon signal 242 primarily represents the voltage across the QDESD 252. If the impedance 256 is provided in the form of a sense resistor, the discharge circuit 250 may also produce a signal proportional to the current through the discharge circuit 250 (i.e., the Imon signal 258). The Imon signal 258, if provided, may be sent to the control circuit 210 for monitoring.

In an example, the Charge signal 212 is asserted by varying its voltage level, e.g., to produce a rectangular or square wave, and is de-asserted by holding its level static (e.g., at either high or low). The high voltage source 220 is then configured to charge the discharge circuit 250 in response to receiving the Charge signal 212 in varying form, and to prevent charging when the Charge signal 212 is static. In this manner, the discharge circuit 250 can only be charged when the Charge signal 212 is varying, and thus cannot occur accidentally if the Charge signal 212 is subject to a fault that causes it to be stuck high or stuck low.

As the QDESD 252 charges, the Vmon signal 242 increases proportionally. In an example, the Vmon signal 242 is an analog voltage having a magnitude that is a fraction of the voltage across the discharge circuit 250. The control circuit 210 includes a measurement circuit (not shown), such as an analog-to-digital converter, comparator, or series of comparators. The measurement circuit is configured repeatedly to measure the Vmon signal 242. The control circuit 210 may also include analog and/or digital filters (not shown) to remove noise from the Vmon signal 242, such as noise introduced by the high voltage source 220. In an example, the control circuit 210 measures the Vmon signal 242 at a fixed sampling rate, such as once every 100 milliseconds. Measured, digital values of the Vmon signal 252 may be stored in a memory (not shown) of the control circuit 210.

Where the impedance 256 includes a sense resistor, the control circuit 210 in an example includes a second measurement circuit (not shown), such as an analog-to-digital converter, comparator, or series of comparators. The second measurement circuit is configured to measure the current through the discharge circuit 250. Measured values of the Imon signal 258 may be stored in the memory of the control circuit 210.

As the discharge circuit 250 continues to charge and the control circuit 210 continues to measure the Vmon signal 242, the control circuit 210 compares newly measured values of the Vmon signal 242 with a predetermined level. The predetermined level corresponds to a voltage across the discharge circuit 250 that is large enough to arm the fireset 150, i.e., that is large enough so that, when the QDESD 252 is charged to this "armed voltage level" and discharged through the LEEFI 254, the LEEFI 254 will detonate the explosive 160. In an example, the armed voltage level is 1000 volts DC.

When the control circuit 210 detects that the armed voltage level has been reached, the control circuit 210 modulates the Charge signal 212 while continuing to monitor the Vmon signal 242 so as to maintain the voltage across the discharge circuit 250 substantially constant at the armed voltage level.

Once the fireset 150 is armed, the control circuit 210 may issue a Fire signal 214. For example, the Fire signal 214 may be issued once the airplane 110 has reached its target. The Fire signal 214 causes the switch 230 to close, effectively short circuiting high and low sides of the discharge circuit 250. In particular, charge accumulated on the QDESD 252 flows through the switch 230, through the impedance 256 (if provided), through the LEEFI 254, and back to the QDESD 252. The resulting high current vaporizes the bridge wire in the LEEFI 254, resulting in a kinetic detonation of the explosive 160. It is expected that the airplane 110, including the fireset 150, will be destroyed when the explosive 160 is detonated.

If, however, the control circuit 210 receives an Abort signal 216 prior to issuing the Fire signal 214, the control circuit 210 initiates an abort sequence. The abort sequence involves preventing the issuance of the Fire signal 214 and de-asserting the Charge signal 212. Accumulated charge on the QDESD 252 is consequently bled off, and the voltage across the discharge circuit 250 begins to decrease. The control circuit 210 monitors the Vmon signal 242, substantially as described above, and compares voltage readings with a value indicative a "safe voltage level." The safe voltage level corresponds to a voltage across the discharge circuit 250 that is too low to activate the LEEFI 254. In an example, the safe voltage level is 500 VDC. When the voltage across the discharge circuit 250, as measured by the voltage monitor 240 and control circuit 210, falls below the safe voltage level, the control circuit 210 activates an indicator, e.g., the Safe signal 218, to communicate that the fireset 150 is in a non-explodable state. In an example, the Safe signal 218 is transmitted to a remote controller or other remote listener to allow actions to be taken to retrieve the airplane 110 for later use.

The voltage monitor 240 thus helps to achieve controlled charging of the QDESD 252, controlled maintenance of charge across the QDESD 252 when the fireset 150 is armed, and controlled discharge of the QDESD 252 when a detonation sequence is aborted. The voltage monitor 240 thus provides information critical both to the operation of the fireset 150 and to its safety.

Figure 3:
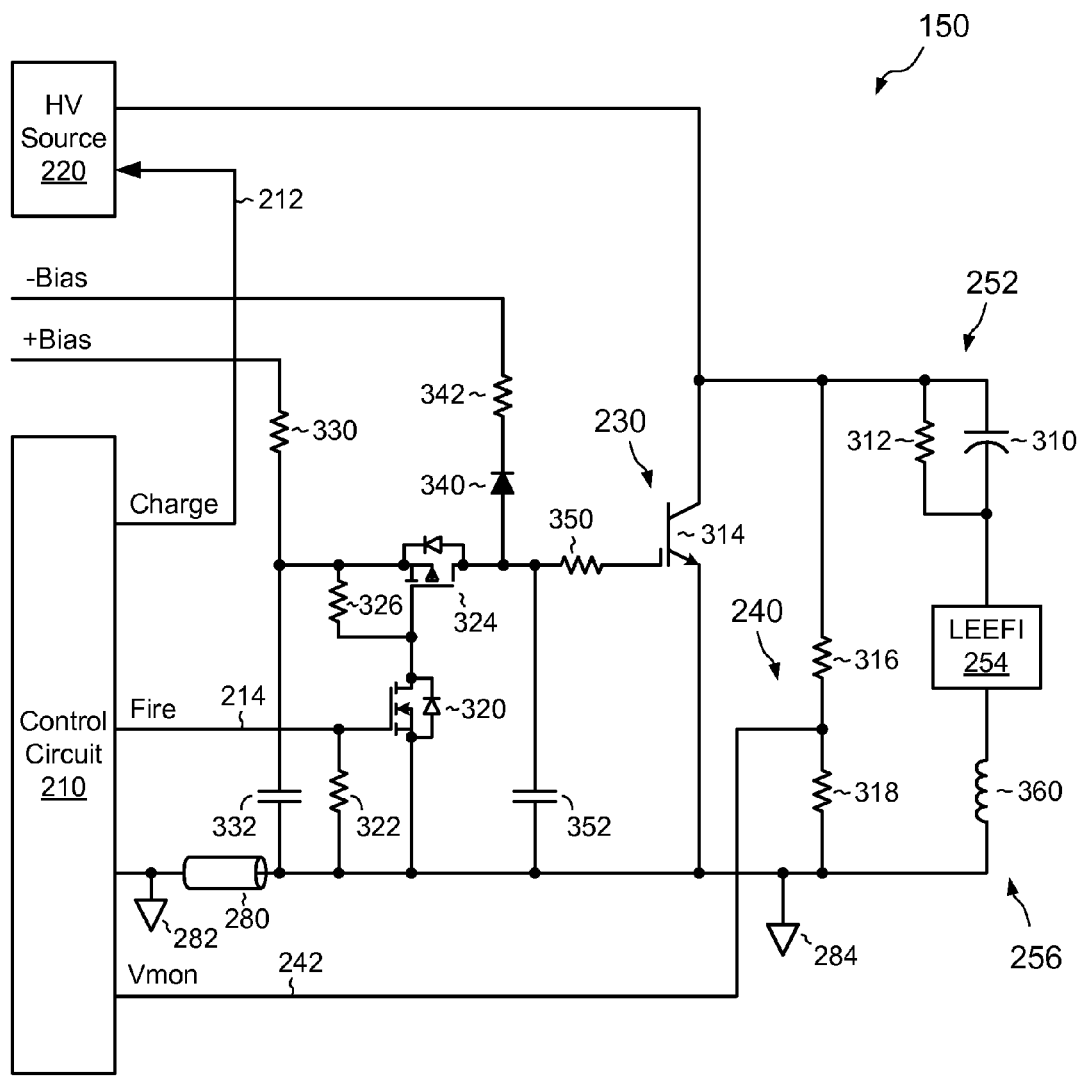
FIG. 3 is a schematic diagram of the example fireset of FIGS. 1 and 2.

FIG. 3 shows a more detailed example of the fireset 150. In this example, the QDESD 252 is seen to include a capacitor 310 having a parallel bleeder resistor 312 and the impedance 256 is seen to include an inductor 360 for reducing ringing. Also, the voltage monitor 240 is seen to include a pair of resistors 316 and 318, which together form a voltage divider. Typically, the value of the resistor 316 is between 100 and 1000 times the value of the resistor 318, so that the Vmon signal 242 is small enough to be measured using a conventional, off the shelf, analog-to-digital converter. As the voltage monitor 240 includes resistors 316 and 318, it also operates as a redundant bleeder for discharging the capacitor 310.

The switch 230 is also seen to include a MOSFET-controlled thyristor (MCT) 314. An MCT was selected on account of its very fast turn-on time and low on-resistance. Suitable MCTs may be obtained, for example, from Silicon Power of Exton, Pa. Alternatively, the device 314 may be implemented with a MOSFET, silicon controlled rectifier (SCR), insulated gate bipolar transistor (IGBT), mechanical relay, or other high voltage switching device. Other components shown in FIG. 3, which may be regarded as parts of the switch 230, include transistors 320 and 324, resistors 322, 326, 330, 342, and 350, capacitors 332 and 352, and a diode 340.

When the Fire signal 214 is in its inactive state, the transistors 320 and 324 are both off. A negative bias voltage (−Bias, e.g., −5 VDC) pulls down on the gate of the MCT 314, through a bias circuit including resistor 342 and diode 340, to ensure that the MCT 314 is kept off. When the Fire signal 214 is then asserted, the transistor 320 turns on. Current flows from +Bias (e.g., +12 VDC), via the resistor 330, through the resistor 326 and the transistor 320. +Bias and −Bias may be generated locally, for example, by a small power supply coupled to the battery 140. The voltage drop across the resistor 326 causes the transistor 324 to turn on. Current then flows, via +Bias and the resistor 330, into the capacitor 352, thereby raising the voltage across the capacitor 352 from approximately −Bias to a positive voltage high enough to turn on the MCT 314. Rapid turn-on of the MCT 314 may cause a reverse charge to be emitted from the gate of the MCT 314. Resistor 350 and capacitor 352 help to filter any such reverse charge and thus protect the transistors 320 and 324 and ensure that they do not spuriously turn back off.

When the MCT 314 turns on, the capacitor 310 quickly discharges through the MCT 314, the inductor 360, and the LEEFI 254. The resulting current pulse may reach 1200 amperes in less than 65 nanoseconds. The bridge wire within the LEEFI 254 is vaporized and the explosive 160 is detonated.

Figure 4:
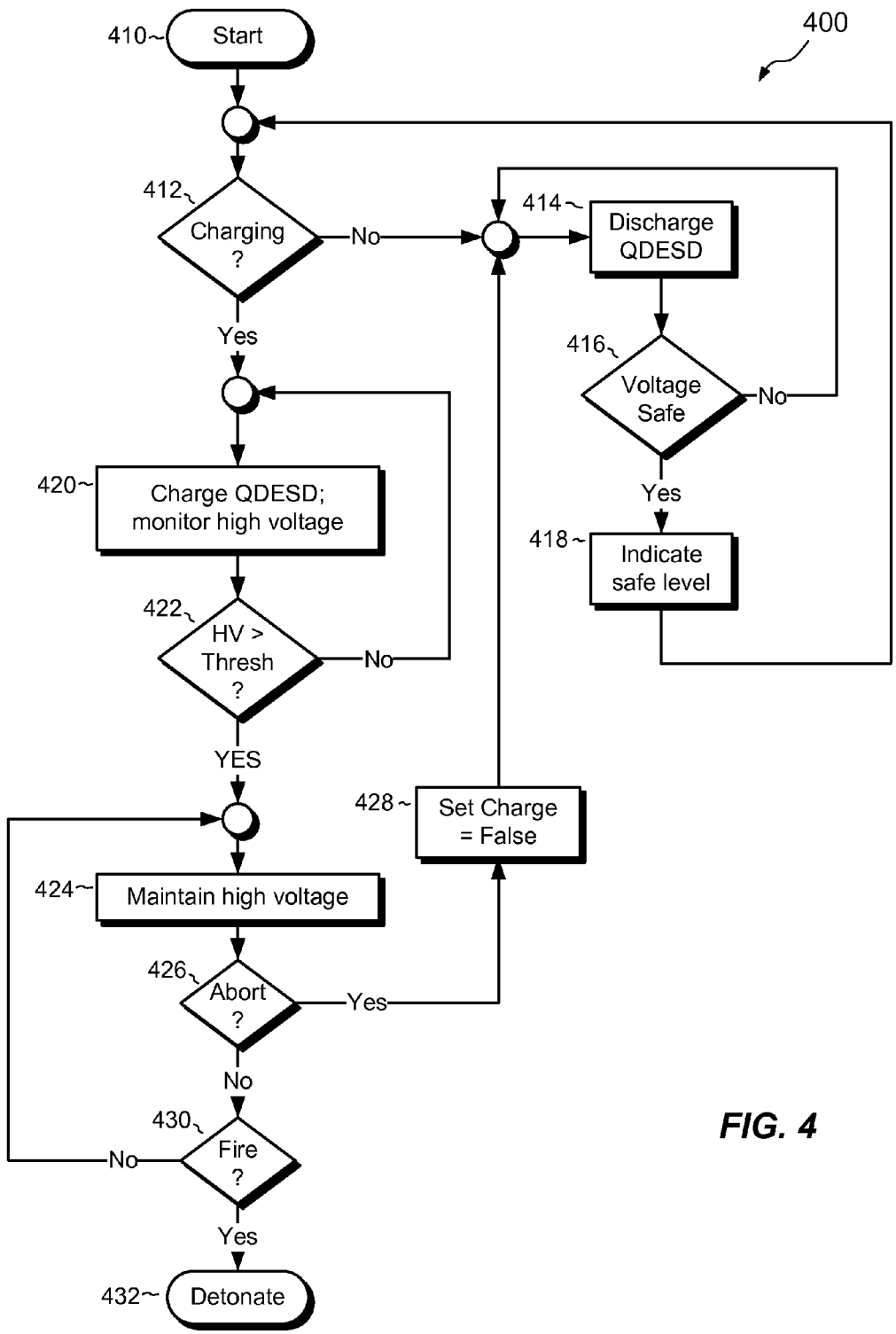
FIG. 4 is a flowchart showing an example detonation sequence conducted using the fireset of FIGS. 1-3.

FIG. 4 shows an example process 400 for operating the fireset 150. In some examples, the process 400 is performed by a processor within the control circuit 210 executing software constructs or firmware. The various acts of the process 400 may be ordered in any suitable way. Accordingly, embodiments may be constructed in which acts are performed in orders different from those illustrated, which may include performing some acts simultaneously, even though the acts are shown as sequential in the illustrated embodiments.

Step 410 identifies a starting point of the process 400. At step 412, it is determined whether the control circuit 210 is in a charging state. If the control circuit 210 is not in a charging state, control proceeds to step 414, where the QDESD 252 is allowed to discharge. For example, the capacitor 310 may be allowed to discharge through the bleeder resistor 312 as well through the resistors 316 and 318. At step 416, the voltage across the discharge circuit 250 is tested to determine whether it is below a known safe level, i.e., one that is assured not to trigger the LEEFI 254 even if a Fire signal 214 is received (e.g., 500 VDC). If the voltage across the discharge circuit 250 has not yet reached the safe level, control returns to step 414, where the QDESD 252 continues to be discharged. Eventually, the safe level is attained and control proceeds to step 418, where the safe level is indicated, e.g., by asserting the Safe signal 218. Control then returns to step 412.

If, at step 412, the control circuit 210 is in a charging state, control proceeds to step 420, where the high voltage source 220 charges the QDESD 252 while the voltage monitor 240 and control circuit 210 repeatedly measure the voltage across the discharge circuit 250. It is noted that the Charge signal 212 is a reflection of the charging state, i.e., it is asserted when the charging state is true and de-asserted when the charging state is false.

At step 422, a determination is made as to whether the voltage across the discharge circuit 250 has yet reached the predetermined threshold at which the fireset 150 is considered armed (e.g., 1000 VDC). If this threshold has not been reached, the high voltage source 220 continues to charge the discharge circuit 250 (i.e., control returns to step 420) and the control circuit 210 continues to test the voltage across the discharge circuit 250 (step 422) until the voltage, as measured by the voltage monitor 240 and control circuit 210, exceeds the predetermined threshold.

Control then proceeds to step 424, where the fireset 150 assumes an armed state and maintains high voltage across the discharge circuit 250 approximately at the predetermined value. Maintenance of this voltage is achieved by regularly monitoring the voltage across the discharge circuit 250 using the voltage monitor 240 and control circuit 210 and by modulating the Charge signal 212. For example, the control circuit 210 may turn the Charge signal 212 on and off as needed in a feedback arrangement to balance charging and discharging of the QSESD 242 so as to maintain constant voltage across the discharge circuit 250.

The fireset 150 may remain in this armed state indefinitely. Generally, however, the control circuit 210 either issues a Fire signal 214 or receives an Abort signal 216. If an Abort signal 216 is received (step 426), the control circuit 210 sets the Charge signal 212 to false (step 428) and control proceeds to steps 414, 416, and 418, where the QDESD 242 is discharged in the manner described above.

If no Abort signal 216 is received, the control circuit 210 may issue a Fire signal 214. In an example, the control circuit 210 receives signals from sensors 170 indicating that the target has been reached, or is about to be reached. If the Fire signal 214 is then asserted (step 430), the fireset 150 detonates the explosive 160 (step 432), at which point the process 400 reaches an end. However, if no Fire signal 214 is asserted, control returns to step 424, where the fireset 150 remains in its armed state, waiting either to fire or to abort.

An improved fireset 150 has been described that includes a voltage monitor 240 arranged to measure a voltage across a QDESD 252 and to perform a detonation sequence based at least in part on the voltage measured by the voltage monitor 240. The voltage monitor 240 promotes accurate charging of the QDESD 252 and accurate maintenance of charge during the armed state. The voltage monitor 240 also promotes safety by measuring the voltage across the QDESD 252 and indicating when a safe voltage is present, i.e., one which is assured not to activate the LEEFI 254.

As used throughout this document, the words "comprising," "including," and "having" are intended to set forth certain items, steps, elements, or aspects of something in an open-ended fashion. Although certain embodiments are disclosed herein, it is understood that these are provided by way of example only and the invention is not limited to these particular embodiments.

Having described certain embodiments, numerous alternative embodiments or variations can be made. For example, the fireset 150 has been shown and described as part of a remote-controlled airplane. This is merely an example, however. Alternatively, the fireset 150 may be used in projectiles, including but not limited to bombs, smart bombs, or bullets. The fireset 150 may also be used in construction applications, where blasting is required, in controlled demolition applications, or in any application benefitting from controlled detonation.

Those skilled in the art will therefore understand that various changes in form and detail may be made to the embodiments disclosed herein without departing from the scope of the invention.

What is claimed is:

1. A fireset for detonating an explosive, comprising:
  a discharge circuit including a quickly dischargeable energy storage device coupled in series with a LEEFI (Low Energy Exploding Foil Initiator);
  a high voltage source coupled to the discharge circuit to charge the quickly dischargeable energy storage device;
  a high voltage switch coupled to the discharge circuit and having a control input;
  a high voltage monitor coupled to the discharge circuit and having an output arranged to provide a voltage proportional to the voltage across the discharge circuit; and
  a control circuit having an input coupled to the output of the high voltage monitor and an output coupled to the control input of the high voltage switch, the control circuit constructed and arranged to close the high voltage switch based at least in part on the voltage proportional to the voltage across the discharge circuit exceeding a predetermined threshold,
  wherein the discharge circuit further includes an inductor coupled in series with the quickly dischargeable energy storage device to limit ringing when the high voltage switch is activated.

2. The fireset of claim 1, wherein the control circuit is constructed and arranged to measure the voltage at the output of the high voltage monitor.

3. The fireset of claim 2, wherein the high voltage monitor and the control circuit are each electrically coupled to a common ground reference.

4. The fireset of claim 2, wherein the quickly dischargeable energy storage device includes a high voltage capacitor with a ceramic dielectric.

5. The fireset of claim 4, wherein the high voltage switch includes a MOSFET-controlled thyristor (MCT), and wherein the control input of the high voltage switch is a gate of the MCT.

6. The fireset of claim 5, further comprising a resistor having a first terminal and a second terminal, the second terminal coupled to the gate of the MCT.

7. The fireset of claim 6, further comprising a second capacitor coupled between the first terminal of the resistor and the common ground reference.

8. The fireset of claim 7, further comprising a biasing circuit coupled to the first terminal of the resistor to negatively bias the gate of the MCT.

9. The fireset of claim 4, wherein the high voltage capacitor is provided in a package that includes a bleeder resistor coupled in parallel with the high voltage capacitor.

10. The fireset of claim 1, wherein the high voltage monitor includes a resistive voltage divider.

11. The fireset of claim 1, wherein the discharge circuit further includes a current sensing resistor coupled in series with the quickly dischargeable energy storage device.

12. The fireset of claim 1, wherein the control circuit has a second output coupled to the high voltage source to control the high voltage source to charge the quickly dischargeable energy storage device.

13. A fireset for detonating an explosive, comprising:
  a discharge circuit including a high voltage capacitor coupled in series with a LEEFI (Low Energy Exploding Foil Initiator);
  a high voltage source coupled to the discharge circuit to charge the high voltage capacitor;
  a high voltage switch coupled to the discharge circuit and having a control input;

a high voltage monitor coupled to the discharge circuit and having an output arranged to provide a signal proportional to the voltage across the discharge circuit; and a control circuit having an input electrically coupled to the output of the high voltage monitor, a first output electrically coupled to the control input of the high voltage switch, and a second output electrically coupled to the high voltage source, the control circuit constructed and arranged to close the high voltage switch based at least in part on the signal proportional to the voltage across the discharge circuit exceeding a predetermined threshold, wherein the high voltage switch is coupled to a first ground and the control circuit is coupled to a second ground, and wherein the fireset further comprises an inductive element through which the first ground is coupled to the second ground.

14. The fireset of claim 13, wherein the high voltage capacitor has a ceramic dielectric, and wherein the high voltage switch includes a mosfet-controlled thyristor.

15. A method of detonating an explosive using a fireset, comprising:

charging, from a high voltage source, a discharge circuit including a quickly dischargeable energy storage device coupled in series with a LEEFI (Low Energy Exploding Foil Initiator);

monitoring a voltage across the discharge circuit; and activating, by a control circuit, a first control signal to close a high voltage switch coupled to the discharge circuit, based at least in part on the monitoring indicating that the voltage across the discharge circuit exceeds a predetermined threshold, wherein the method further comprises:

prior to charging the discharge circuit, activating, by the control circuit, a second control signal to charge the discharge circuit;

receiving, by the control circuit, an indication that detonation is to be aborted;

deactivating, by the control circuit, the second control signal;

bleeding off charge from the quickly dischargeable energy storage device to reduce the voltage across the discharge circuit to a safe level below which discharge of the quickly dischargeable energy storage device through the LEEFI does not result in detonation; and indicating a safe condition in response to the monitoring of the voltage across the discharge circuit indicating that the voltage across the discharge circuit is below the safe level.

16. The fireset of claim 13, wherein the discharge circuit further includes an inductor coupled in series with the high voltage capacitor to limit ringing when the high voltage switch is activated.

17. The fireset of claim 13, wherein the high voltage switch comprises a MOSFET-controlled thyristor (MCT) that conducts current from the high voltage capacitor through the LEEFI when the high voltage switch is closed.

18. The fireset of claim 17, wherein the MCT has a gate and wherein the fireset further comprises a biasing circuit coupled to the gate of the MCT to bias the MCT to an off condition.

19. The fireset of claim 13, further comprising a safe indicator to indicate that the fireset is in a safe, non-explodable state.

20. The fireset of claim 13, wherein the discharge circuit further includes a current sense resistor coupled to the control circuit to enable the control circuit to measure current through the LEEFI.

* * * * *